(12) United States Patent
Sung

(10) Patent No.: US 8,766,333 B2
(45) Date of Patent: Jul. 1, 2014

(54) SEMICONDUCTOR DEVICE AND METHOD OF MANUFACTURING THE SAME

(75) Inventor: Min Chul Sung, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 33 days.

(21) Appl. No.: 13/326,280

(22) Filed: Dec. 14, 2011

(65) Prior Publication Data

US 2012/0153365 A1 Jun. 21, 2012

(30) Foreign Application Priority Data

Dec. 16, 2010 (KR) .................. 10-2010-0129291

(51) Int. Cl.
*H01L 29/76* (2006.01)
*H01L 27/108* (2006.01)

(52) U.S. Cl.
USPC ........................ 257/288; 257/296; 257/302

(58) Field of Classification Search
USPC ........... 438/268–374; 257/263–268, 327–328
See application file for complete search history.

(56) References Cited

U.S. PATENT DOCUMENTS

| 7,569,876 | B2 * | 8/2009 | Forbes | 257/288 |
| 2001/0001722 | A1 * | 5/2001 | Forbes et al. | 438/268 |
| 2001/0010957 | A1 * | 8/2001 | Forbes et al. | 438/248 |
| 2004/0007721 | A1 * | 1/2004 | Forbes et al. | 257/204 |
| 2006/0003525 | A1 * | 1/2006 | Noble et al. | 438/243 |
| 2006/0113587 | A1 | 6/2006 | Thies et al. | |

FOREIGN PATENT DOCUMENTS

KR 1020090041755 A 4/2009

* cited by examiner

*Primary Examiner* — Karen Kusumakar

(57) ABSTRACT

A semiconductor device includes a first buried bit line (120*a*) provided between lower and upper substrates (100*b*, 100*a*), first and second pillar patterns (105*a*, 105*b*) extending from the upper substrate (100*a*) and coupled to the first buried bit line (120*a*) through first and second gate patterns (140*a*), respectively. A first body contact pattern (160*a*) coupled to the first and/or the second pillar patterns (105*a*, 105*b*) through the upper substrate (100*a*) prevents the first and the second pillar patterns from floating.

25 Claims, 13 Drawing Sheets

SEMICONDUCTOR DEVICE AND METHOD OF MANUFACTURING THE SAME

CROSS-REFERENCES TO RELATED APPLICATION

The present application claims priority to Korean patent application number 10-2010-0129291 filed on 16 Dec. 2010, which is incorporated by reference in its entirety.

BACKGROUND OF THE INVENTION

1. Technical Field

The inventive concept relates to a semiconductor device and a method of manufacturing the same, and more particularly to, a semiconductor device having a vertical gate and a method of manufacturing the same.

2. Related Art

As the integration degree of semiconductor devices is increased, channel lengths of transistors are gradually reduced. The reduction of the channel lengths of the transistors causes a short channel effect such as drain induced barrier lowering (DIBL), a hot carrier effect, and punch-through. So as to solve this problem, various methods such as a method of reducing a depth of a junction region or a method of relatively increasing a channel length by forming a recess in a channel region of a transistor have been suggested.

However, as the integration density of the semiconductor memory devices, in particular, dynamic random access memories (DRAMs) approach Giga bit, transistors having a smaller size is demanded. That is, transistors of DRAMs having a Giga-bit grade require a device area of below 8F2 (F: minimum feature size), further a device area of about 4F2. Accordingly, it is difficult to satisfy the desired device area in a current planar transistor structure in which a gate electrode is formed on a semiconductor substrate and junction regions are formed at both sides of the gate electrode even when scaling the channel length. So as to solve this problem, a vertical channel transistor structure has been suggested.

In the vertical channel transistor structure, as a linewidth of a device is reduced, a body floating effect in which a body region is electrically isolated from a silicon substrate by a source/drain junction regions located below a vertical gate is caused. When the body floating effect is caused, a threshold voltage of the transistor is varied by hole charges accumulated in the body.

SUMMARY

Embodiments of the inventive concept provide a semiconductor device and a method of manufacturing the same, capable of preventing a body of each pillar pattern from being floated by applying a bias after a silicon line is formed on a buried bit line and a metal contact is formed in the silicon line.

According to one aspect of an exemplary embodiment, a semiconductor device includes a plurality of line patterns formed on a semiconductor substrate, pillar patterns formed by etching upper portions of the line patterns, word lines intersecting the line patterns and formed on sidewalls of the plurality of pillar patterns, and body contacts formed on some of the line patterns between the pillar patterns.

The semiconductor device may further include a bit line disposed within each of the line patterns. The bit line may include a bit line junction region. The bit line may be formed to be spaced at a constant distance from an upper surface of each of the line patterns.

The line pattern on the bit line is doped with p type ions. The word line may include any one selected from the group consisting of titanium nitride (TiN), tungsten (W), and a combination thereof.

The semiconductor device may further include a plurality of gates between pillar patterns in a direction intersecting the line patterns. Each of the word lines connects gates of the plurality of gates arranged in the direction intersecting the line patterns. Each of the gates is formed on a sidewall of each of the pillar patterns and the gate is formed to have the same surface level as an upper height of the bit line or to extend downwardly by a depth overlapping with the bit line.

According to another aspect of an exemplary embodiment, a method of manufacturing a semiconductor device include forming a plurality of line patterns on a semiconductor substrate, forming pillar patterns by etching upper portions of the plurality of line patterns, forming word lines intersecting the line patterns, and forming body contacts on some of the plurality of line patterns between the pillar patterns.

The method may further include forming a bit line within each of the line patterns. The forming the bit line may include forming a bit line layer by performing an ion implantation process to an entire surface of the semiconductor substrate, and etching the semiconductor substrate to form the plurality of line patterns and to separate the bit line layer. Alternatively, the forming the bit line may include forming a plurality of line type patterns by etching the semiconductor substrate, forming a bit line layer by performing an ion implantation process to an entire surface of the semiconductor substrate including the patterns, and etching the patterns to form the plurality of line patterns and to separate the bit line layer.

The bit line may include a bit line junction region. The bit line may be formed to be spaced at constant distance from an upper surface of each of the line patterns. The line pattern on the bit line may be doped with p type impurities. The method may further include forming an interlayer insulating layer on the semiconductor substrate between each of line patterns including the bit line and each of the pillar patterns. The interlayer insulating layer may be formed so that upper surface of the interlayer insulating layer has the same surface level as that of the bit line or has the lower surface level than that of the bit line.

The forming the word line may include forming a conductive layer on the interlayer insulating layer between each of the line patterns and each of the pillar patterns, forming a spacer on a sidewall of each of the pillar patterns on the conductive layer, and etching the conductive layer using the spacer as an etch mask. The forming the conductive layer may include forming a conductive layer including any one selected from the group consisting of titanium nitride, tungsten and a combination thereof. The forming the word line may further include forming an insulating layer on a sidewall of each of the pillar patterns before the forming the conductive layer.

The forming the word line may further include forming a plurality of gates between the pillar patterns in a direction intersecting the line patterns. Each of the word line may connect some of the plurality of gates formed between the pillar patterns in the direction intersecting the line patterns. The gates may be formed so that each of the gates has the same surface level as an upper surface of the bit line or extends to overlap with the bit line.

According to the other aspect of an exemplary embodiment, a semiconductor device includes a first buried bit line (120*a*) provided between a lower substrate (100*b*) and a first upper substrate (100*a*1), first and second pillar patterns (105*a*, 105*b*) extending from the first upper substrate (100*a*1)

and coupled to the first buried bit line (120a) through first and second gate patterns (140a), respectively, and a first body contact pattern (160a) coupled to any of the first and the second pillar patterns (105a, 105b).

The first body contact pattern (160a) is commonly coupled to the first and the second pillar patterns (105a, 105b) through the first upper substrate (100a1). The first body contact pattern (160a) is formed parallel to a direction of the first and the second pillar patterns (105a, 105b). The first buried bit line (120a) is arranged along a first direction (A direction), and wherein the first body contact pattern (160a) is arranged along a second direction (B direction) perpendicular to the first direction.

The first body contact pattern (160a) includes conductive material. The first body contact pattern (160a) is grounded or fixed at given voltage level. The first body contact pattern (160a) is coupled to any of the first and the second pillar patterns (105a, 105b) through the upper substrate (100a). The first and the second gate patterns (140a, 140b) are arranged along the second direction (B direction).

A second buried bit line (120b) provided between the lower substrate (100b) and a second upper substrate (100a2) and arranged in parallel to the first buried bit line (120a), third and fourth pillar patterns (105c, 105d) coupled to the second buried bit line (120b) through third and fourth gate patterns (140c, 140d), respectively; and a second body contact pattern (160b) coupled to any of the third and the fourth pillar patterns (105c, 105d).

The second body contact pattern (160b) is commonly coupled to the third and the fourth pillar patterns (105c, 105d) through the second upper substrate (100a2). The second body contact pattern (160b) is arranged perpendicular (B direction) to the second buried bit line (120c, 120d). A first word line (240a) coupled to the first and the third gate patterns (140a, 140c), and a second word line (240b) coupled to the second and the fourth gate patterns (140b, 140d).

The first and the second buried bit lines (120a, 120b) are each arranged along a first direction (A direction), wherein the first and the second body contact patterns (160a, 160b) are each arranged along a second direction (B direction) perpendicular to the first direction, and wherein the first and the second word lines (240a, 240b) are each arranged along a third direction (C direction) perpendicular to both of the first and the second directions.

According to the other aspect of an exemplary embodiment, A method of manufacturing a semiconductor device, comprising: forming a first buried bit line (120a) in a semiconductor substrate (100) between a lower substrate (100b) and a first upper substrate (100a1), forming first and second pillar patterns (105a, 105b) each extending from the first upper substrate (100a), forming first and second gate patterns (140a) coupling first and second pillar patterns (105a, 105b) to the first buried bit line (120a), respectively, forming a first body contact pattern (160a) extending from the first upper substrate (100a1) and coupled to any of the first and the second pillar patterns (105a, 105b).

The first body contact pattern (160a) is commonly coupled to the first and the second pillar patterns (105a, 105b). The forming the first bit line (120a) includes: forming a bit line layer (120) by performing an ion implantation process into substrate (100) so that the substrate (100) is divided into the lower substrate (100b) and an upper substrate (100a); and etching the upper substrate (100a) and the bit line layer (120) to form the first upper substrate (100a1) and the first buried bit line (120a).

The first bit line (120a) includes: forming a first substrate line pattern (105-1) by etching a substrate (100); forming a bit line layer (120) by performing an ion implantation process under the first substrate line pattern (105-1); and etching the substrate (100) and the bit line layer (120) using the first substrate line pattern (105-1) as a mask to form and to separate the bit line layer the first substrate line pattern (105-1) and the first buried bit line (120a).

Providing a first buried bit line (120a) between a first upper substrate pattern (100a1) and a lower substrate pattern (100b); providing a second buried bit line (120b) between a second upper substrate pattern (100a2) and the lower substrate pattern (100b); patterning the first upper substrate pattern (100a1) to form first and second pillar patterns (105a, 105b); patterning the second upper substrate pattern (100a2) to form third and fourth pillar patterns (105c, 105d); forming first and second gate patterns (140a, 140b) over sidewalls of the first and the second pillar patterns (105a, 105b) so as to couple the first and the second pillar patterns (105a, 105b) to the first bit line (120a); forming third and fourth gate patterns (140c, 140d) over sidewalls of the third and the fourth pillar patterns (105c, 105d) so as to couple the third and the fourth pillar patterns (105c, 105d) to the second bit line (120b); forming a first body contact pattern (160a) coupled to the first and the second pillar patterns (105a, 105b) through the first upper substrate pattern (100a1); and forming a second body contact pattern (160b) coupled to the third and the fourth pillar patterns (105c, 105d) through the second upper substrate pattern (100a2).

The step of (i) providing the first buried bit line (120a) between the first upper substrate pattern (100a1) and the lower substrate pattern (100b) and (ii) providing the second buried bit line (120b) between the second upper substrate pattern (100a2) and the lower substrate pattern (100b) comprising: patterning a substrate (100) along a first direction (A direction) to form first and second line patterns (105-1, 105-2); forming first and second buried bit line layer (120a, 120b) in the substrate (100) to divide the substrate into the lower substrate and first and the second upper substrates (100a1, 100as2); and patterning the buried bit line layer (120) and the upper substrate (100a) along a second direction (B direction) perpendicular to the first direction to form first and second buried bit lines (120a, 120b) and first and second upper substrate patterns (100a) each arranged along the first direction.

forming a first word line (240a) coupled to the first and the third gate patterns (140a, 140c) and arranged along the second direction (B direction), and forming a second word line (240b) coupled to the second and the forth gate patterns (140b, 140d) and arranged in parallel to the first word line (24a).

These and other features, aspects, and embodiments are described below in the section entitled "DESCRIPTION OF EXEMPLARY EMBODIMENT"

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIGS. 2A to 2L are cross-sectional views illustrating a method of manufacturing a semiconductor device according to an exemplary embodiment of the inventive concept, wherein (i) is a cross-sectional view of the semiconductor device taken along line X-X' of FIG. 1, (ii) is a cross-sectional view of the semiconductor device taken along line Y1-Y1' of FIG. 1, and (iii) is a cross-sectional view of the semiconductor device taken along line Y2-Y2' of FIG. 1.

DESCRIPTION OF EXEMPLARY EMBODIMENT

Figure 1:
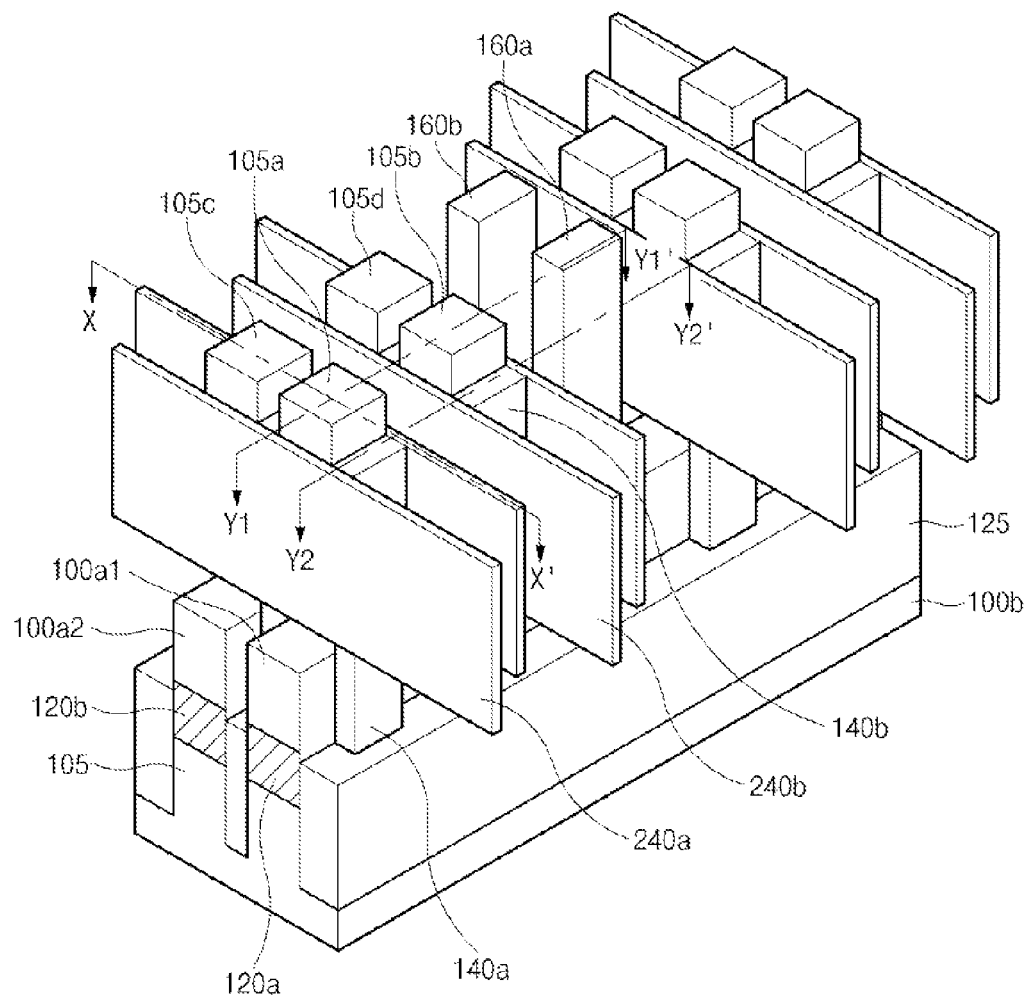
FIG. 1 is a schematic perspective view illustrating a semiconductor device according to an exemplary embodiment of the inventive concept.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Hereinafter, a semiconductor device and a method of manufacturing the same according to an exemplary embodiment of the inventive concept will be described in detail with reference to accompanying drawings.

FIG. 1 is a schematic perspective view illustrating a semiconductor device according to an exemplary embodiment of the inventive concept. The semiconductor device having a vertical gate will be described with reference to FIG. 1. FIG. 2L(i) is a cross-sectional view of the semiconductor device taken along line X-X' of FIG. 1, (ii) is a cross-sectional view of the semiconductor device taken along line Y1-Y1' of FIG. 1, and (iii) is a cross-sectional view of the semiconductor device taken along line Y2-Y2' of FIG. 1.

Referring to FIGS. 1 and 2L, a semiconductor device according to an embodiment of the present invention includes: a first buried bit line (120a) provided between lower and upper substrates (100b, 100a1, 100a2); first and second pillar patterns (105a, 105b) extending from the upper substrate (100a) and coupled to the first buried bit line (120a) through first and second gate patterns (140a, 140b), respectively; and a first body contact pattern (160a) coupled to any of the first and the second pillar patterns (105a, 105b) so as to prevent the first and the second pillar patterns from floating. The first body contact pattern (160a) may be commonly coupled to the first and the second pillar patterns (105a, 105b) through the upper substrate (100a1).

The first body contact pattern (160a) is formed in parallel to the direction (B direction) along which the first and the second pillar patterns (105a, 105b) are arranged. The first buried bit line (120a) is arranged along a first direction (A direction or Y1-Y1' direction), and the first body contact pattern (160a) is arranged along a second direction (B direction) perpendicular to the first direction.

The first body contact pattern (160a) may include conductive material. The first body contact pattern (160a) can be grounded. The first body contact pattern (160a) can be coupled to any of the first and the second pillar patterns (105a, 105b) through the upper substrate (100a). The first and the second gate patterns (140a, 140b) are arranged along the second direction (B direction).

The semiconductor device may further include a second buried bit line (120b) provided between the lower and the upper substrates (100, 100a1) and arranged in parallel to the first buried bit line (120a), and third and fourth pillar patterns (105c, 105d) coupled to the second buried bit line (120b) through third and fourth gate patterns (140c, 140d), respectively. A second body contact pattern (160b) coupled to any of the third and the fourth pillar patterns (105c, 105d) may be provided so as to prevent the third and the fourth pillar patterns (105c, 105d) from floating.

The second body contact pattern (160b) may be commonly coupled to the third and the fourth pillar patterns (105c, 105d) through the upper substrate (100a). The second body contact pattern (160b) is arranged along the second direction (B direction) to be perpendicular to the second buried bit line (120b).

The semiconductor device further includes a first word line (240a) coupled to the first and the third gate patterns (140a, 140c), and a second word line (240b) coupled to the second and the fourth gate patterns (140b, 140d). The first and the second buried bit lines (120a, 120b) are each arranged along a first direction (A direction or Y1-Y1' direction). The first and the second body contact patterns (160a, 160b) are each arranged along a second direction (B direction) perpendicular to the first direction. The first and the second word lines (240a, 240b) are each arranged along a third direction (C direction or X-X' direction) perpendicular to both of the first and the second directions.

A bias is applied to the silicon line 100a through the body contact 160 to make holes generated in the pillar patterns 105a-d be drained through the body contact 160, thereby preventing a floating body.

FIGS. 2a to 2l are cross-sectional views illustrating a method of fabricating a semiconductor device according to an exemplary embodiment of the inventive concept, wherein (i) is a cross-sectional view taken along line X-X' of FIG. 1, (ii) is a cross-sectional view taken along line Y1-Y1' of FIG. 1, and (iii) is a cross-sectional view taken along line Y2-Y2' of FIG. 1.

A semiconductor device according to an embodiment of the present invention can be fabricated by the following method. A first buried bit line (120a) is formed in a semiconductor substrate (100) between lower and upper substrates (100b, 100a). First and second pillar patterns (105a, 105b) each extending from the upper substrate (100a) are formed. First and second gate patterns (140a, 140b) are formed which couple the first and the second pillar patterns (105a, 105b) to the first buried bit line (120a), respectively.

A first body contact pattern (160a) extending from the upper substrate (100a) is formed. The first body contact pattern (160a) is coupled to any of the first and the second pillar patterns (105a, 105b) so as to prevent the first and the second pillar patterns (105a, 105b) from floating.

The first body contact pattern (160a) is commonly coupled to the first and the second pillar patterns (105a, 105b).

Referring to FIGS. 2a-l, a first buried bit line (120a) is provided between a first upper substrate pattern (100a1) and a lower substrate pattern (100b). In the same manner, a second buried bit line (120b) is provided between a second upper substrate pattern (100a2) and the lower substrate pattern (100b). See FIG. 2c.

The first upper substrate pattern (100a1) is patterned to form first and second pillar patterns (105a, 105b). In the same manner, the second buried bit lines (120b) is patterned to form third and fourth pillar patterns (105c, 105d). See FIG. 2e.

First and second gate patterns (140a, 140b) are formed over sidewalls of the first and the second pillar patterns (105a, 105b) so as to couple the first and the second pillar patterns (105a, 105b) to the first bit line (120a). In the same manner, third and fourth gate patterns (140c, 140d) are formed over sidewalls of the third and the fourth pillar patterns (105c, 105d) so as to couple the third and the fourth pillar patterns (105d, 105d) to the second bit line (120a). See FIG. 2j.

A first body contact pattern (160a) is formed to be coupled to the first and the second pillar patterns (105a, 105b) through the first upper substrate pattern (100a1). The first body contact pattern (160a) may include conductive material and prevent the first and the second pillar patterns (105a, 105b) from floating. See FIG. 2l. In the same manner, a second body contact pattern (160b) is formed to be coupled to the third and the fourth pillar patterns (105c, 105d) through the second upper substrate pattern (100a2). The second body contact pattern (160b) may include conductive material and prevent the third and the fourth pillar patterns (105c, 105d) from floating. See FIG. 2l. The first and the second body contact patterns (160a, 160b) each may be coupled to a metal interconnection 165 to be grounded.

A first word line (240a) coupled to the first and the third gate patterns (140a, 140c) may be formed. The first word line (240a) is arranged along the second direction (B direction). A second word line (240b) coupled to the second and the forth gate patterns (140b, 140d) is formed in parallel to the first word line (240a). The step shown in FIG. 2c of (i) providing the first buried bit line (120a) between the first upper substrate pattern (100a1) and the lower substrate pattern (100b) and (ii) providing the second buried bit line (120b) between the second upper substrate pattern (100a2) and the lower substrate pattern (100b) may performed by the following processes.

First, a substrate (100) is patterned along a first direction (A direction) to form first and second line patterns (105-1, 105-2). See FIG. 2a. First and second buried bit line layers (120a, 120b) in the substrate (100) are formed in the manner of dividing the substrate into the lower substrate and first and the second upper substrates (100a1, 100a2). See FIG. 2b. Then, the buried bit line layer (120) and the upper substrate (100a) are patterned along a second direction (B direction) perpendicular to the first direction to form first and second buried bit lines (120a, 120b) and first and second upper substrate patterns (100a) each arranged along the first direction. FIG. 2c.

The first bit line (120a) may be formed by the following process. First, a bit line layer (120) is formed by performing an ion implantation process into substrate (100) so that the substrate (100) is divided into the lower substrate (100b) and an upper substrate (100a). The upper substrate (100a) and the bit line layer (120) is patterned to form the first upper substrate (100a1) and the first buried bit line (120a).

Hereinafter, a method according to an embodiment of the present invention will be described in more detail in reference to FIGS. 2a-2l.

Figure 2A:
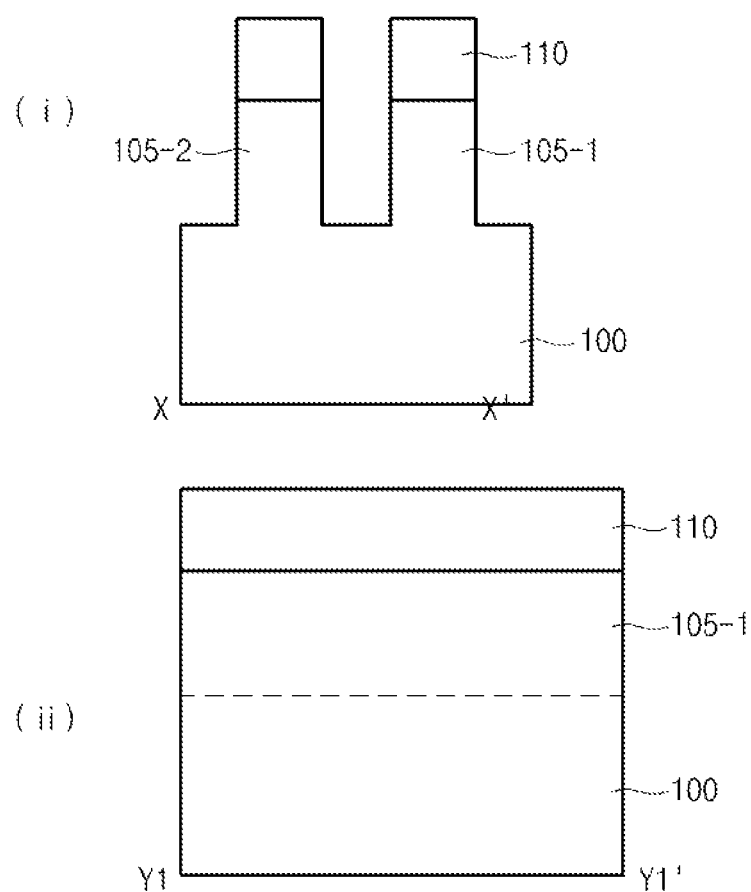

First, referring to FIG. 2a, a first hard mask layer is formed on a semiconductor substrate 100 which is a silicon layer. Here, the semiconductor substrate 100 may be a p type silicon layer. The first hard mask layer may include a nitride layer, an oxide layer or a combination thereof. Next, a mask pattern (not shown) defining a bit line is formed on the first hard mask layer. The first hard mask layer is etched using the mask pattern as an etch mask to form a first hard mask pattern 110. Subsequently, the semiconductor substrate 100 is etched using the first hard mask pattern 110 as an etch mask to form first and second line patterns 105-1, 105-2.

Figure 2B:
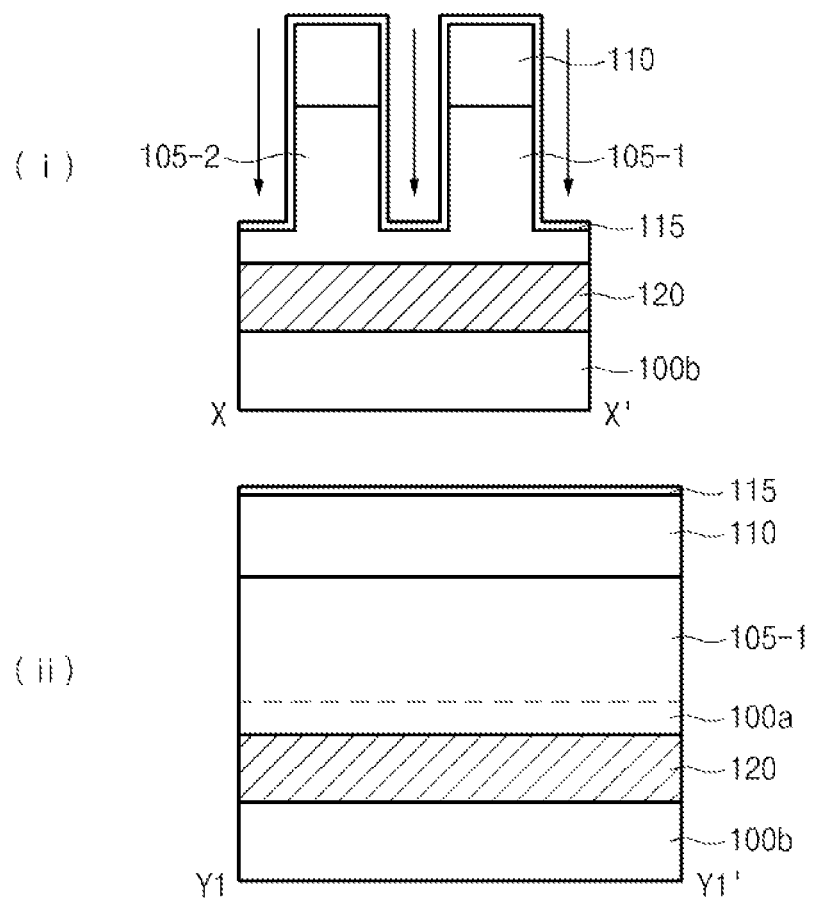
Figure 2C:
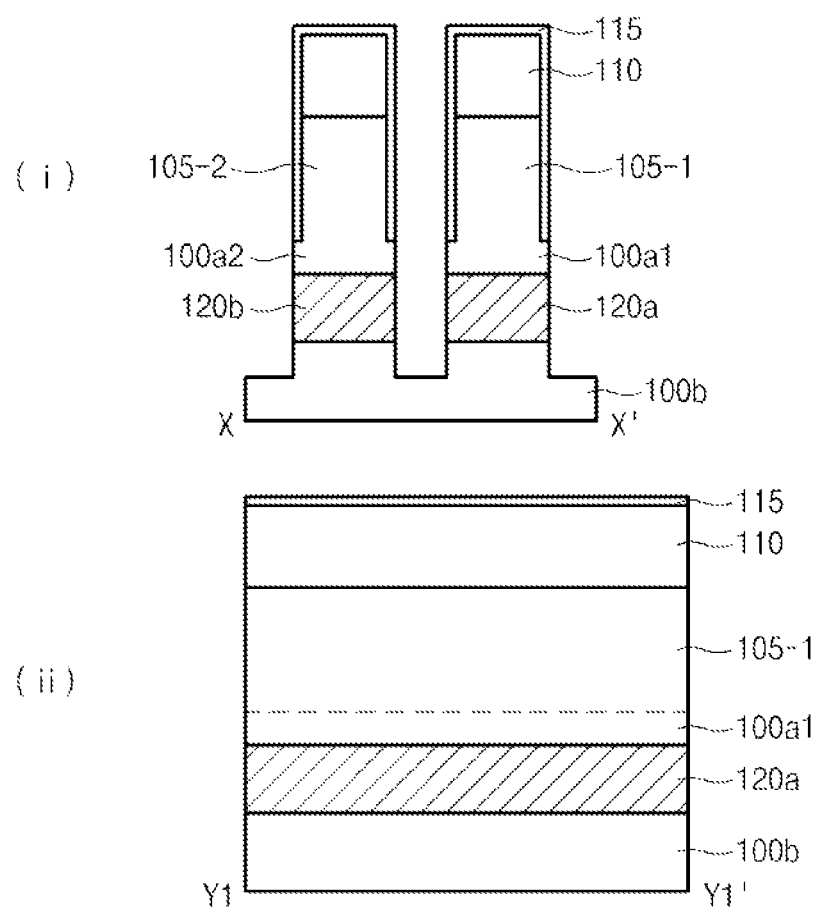

Referring to FIG. 2b, a liner insulating layer 115 is formed on surfaces of the semiconductor substrate 100, the first and second line patterns (105-1, 105-2) and the first hard mask pattern 110. At this time, the liner insulating layer 115 may include an oxide layer.

Next, an ion implantation process for forming a buried bit line is performed to an entire surface including the semiconductor substrate 100, the first and second line patterns 105-1, 105-2 and the first hard mask pattern 110, on which the liner insulating layer 115 is formed. At this time, the ion implantation process may be performed using any of phosphorous (P), arsenic (As) and a combination thereof.

By the ion implantation process, a buried bit line layer 120 is formed in the semiconductor substrate 100 to divide the semiconductor substrate 100 into a lower substrate 100b and an upper substrate 100a. The first and the second buried bit line layer 120a, 120b are formed between the lower and the upper substrates (100b, 100a). The buried bit line layer 120 is formed to have a uniform thickness.

At this time, a concentration of ions implanted within the upper substrate 100a is higher than that of ions implanted within the lower substrate 100b. However, since the implanted ions are diffused in every direction, the buried bit line layer 120 is formed with approximately uniform ion concentration.

Referring to FIG. 2c, the liner insulating layer 115 is etched to expose the portion of the upper substrate 100a1 between the first and second line patterns 105-1 and 105-2. The upper substrate 100a1, and the buried bit line layer 120 are etched using the etched liner insulating layer 115 and the first hard mask pattern 110 as an etch mask, thereby forming separated first and second bit lines 120a, 120b. Since the etching process is a process for separating the buried bit line layer 120, it may be preferable that the etching process be performed to expose the lower substrate 100b below the buried bit line layer 120. Here, since the semiconductor substrate 100 is a p type, the first and the second line patterns 105-1, 105-2 are also a p type silicon layer.

In the particular embodiment described above, after the first and second line patterns 105-1, 105-2 are formed, the buried bit line layer 120 is formed. However, the inventive concept is not limited thereto.

For example, in an alternative embodiment an ion implantation process may be performed on a planar surface of the semiconductor substrate in which the first and second line patterns 105-1 and 105-2 are not formed to form the buried bit line layer within the semiconductor substrate, and then the semiconductor substrate 100 is etched to separate the buried bit line layer 120, thereby forming the first and second bit lines 120a and 120b, while forming the line patterns 105-1 and 105-2.

That is, the first bit line (120a) can be formed by the following processes. A first line pattern (105-1) is formed by etching a substrate (100). A bit line layer (120) is formed by performing an ion implantation process under the first substrate line pattern (105-1). The substrate (100) and the bit line layer (120) are patterned using the first line pattern (105-1) as a mask to form and to separate the bit line layer 120 the first substrate line pattern (105-1) and the first buried bit line (120a).

Figure 2D:
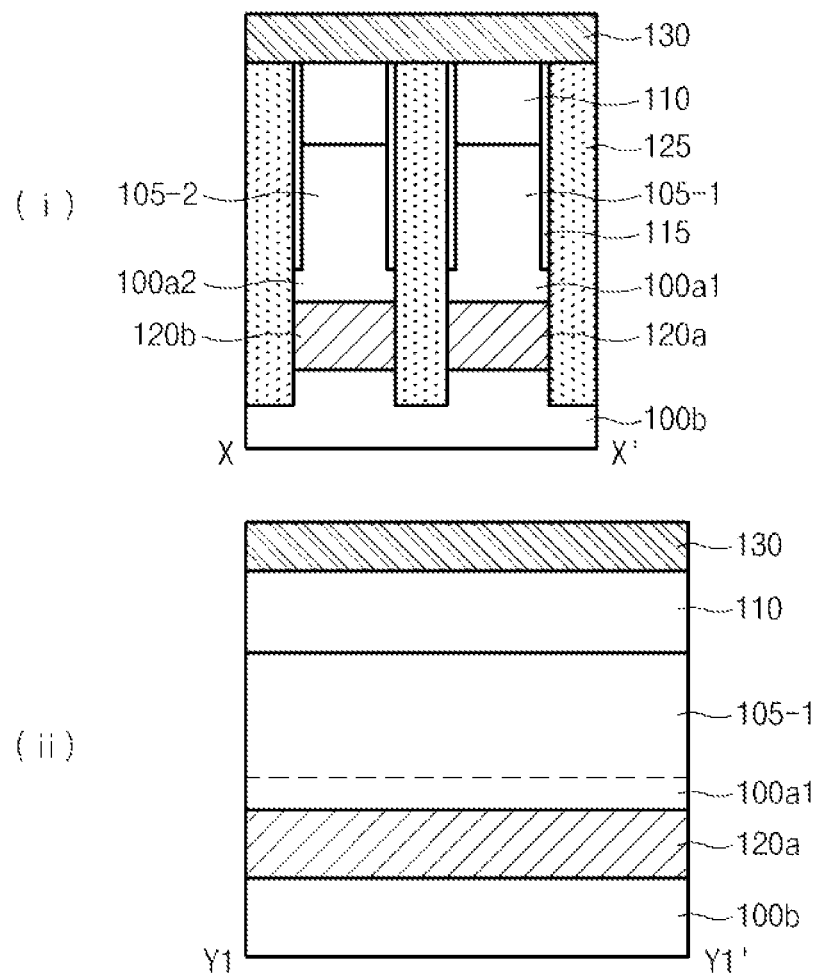

Referring to FIG. 2d, a first interlayer insulating layer 125 is formed on an entire surface of the upper substrate (100a1, 100a2) including the hard mask pattern 110, the first and the second line patterns 105-1, 105-2, and the first and the second bit lines 120a, 120b. A planarization process is performed until the first hard mask pattern 110 is exposed.

At this time, a portion of the liner insulating layer 115 formed on an upper surface of the first hard mask pattern 110 is removed. A second hard mask layer 130 is formed on the first hard mask pattern 110 and the first interlayer insulating layer 125.

Figure 2E:
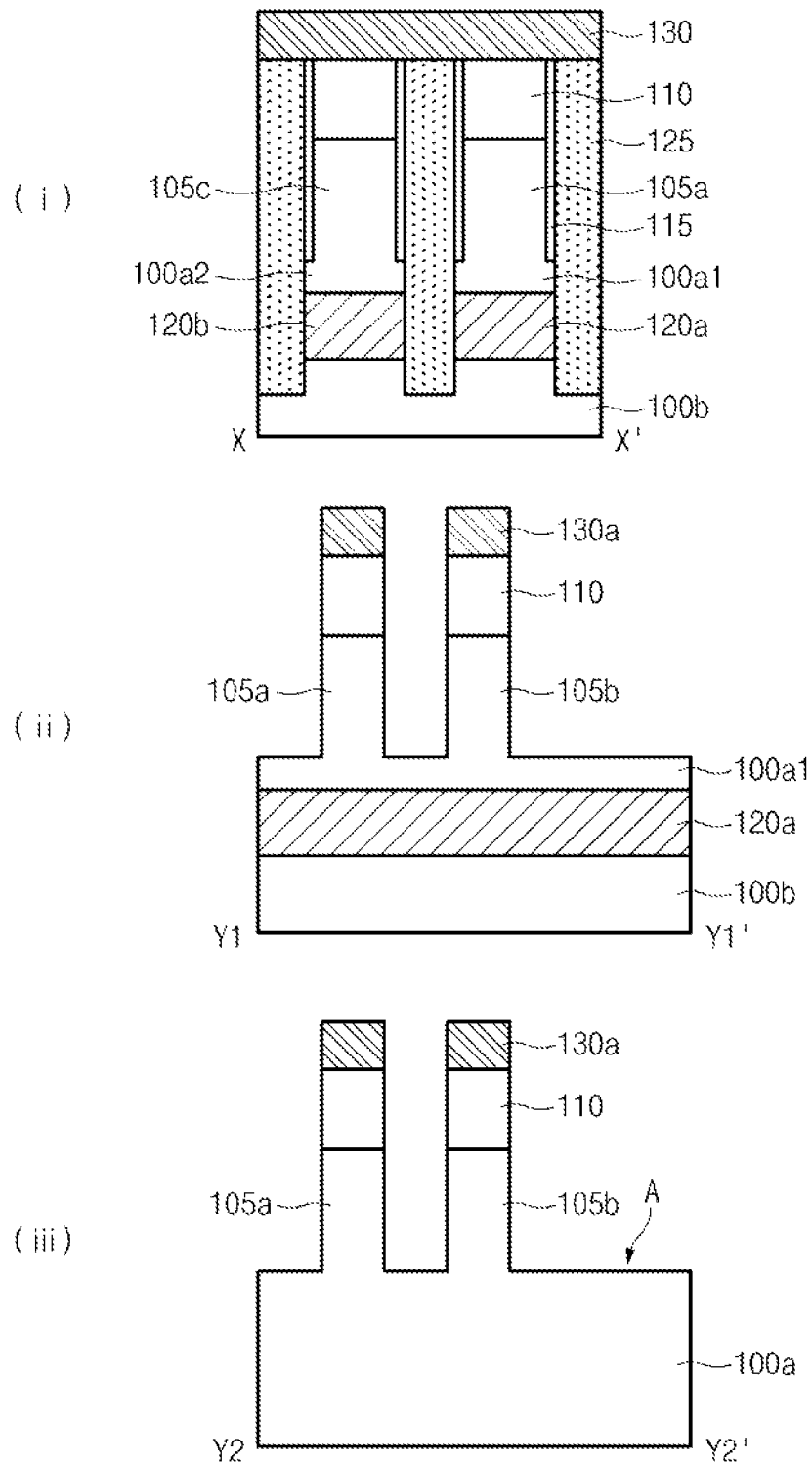

Referring to FIG. 2e, a mask pattern defining a vertical gate is formed on the second hard mask layer 130, and the second hard mask layer 130 is etched using the mask pattern as en etch mask, thereby forming a second hard mask pattern 130a.

The second hard mask pattern 130a has a shape extending in a direction (an X-X' direction or C direction) perpendicular to the first and the second bit lines 120a, 120b.

Next, the first hard mask pattern 110 and the first and the second line patterns 105-1, 105-2 are etched using the second hard mask pattern 130a as an etch mask, thereby forming a hard mask pattern 110 and first, second, third and fourth pillar patterns 105a-105d having island shapes when viewed in a plan view. At this time, it is preferable that the pillar patterns 105a-d be formed so that bottoms of the pillar patterns 105a-d are formed above the first and the second bit lines 120a, 120b in such a manner that the pillar patterns 105a-d extend from the upper substrate 100a1, 100a2.

Later, a first body contact (160a) will extend from the upper substrate (100a1) to couple to the first and the second pillar patterns 105a-b. In the same manner, a second body contact (160b) extends from the upper substrate (100a2) to be coupled to the third and the fourth pillar patterns 105c-d. See FIGS. 1 and 2l.

A method of manufacturing a semiconductor device, comprising: forming a first buried bit line (120a) in a semiconductor substrate (100) between a lower substrate (100b) and a first upper substrate (100a1), forming first and second pillar patterns (105a, 105b) each extending from the first upper substrate (100a), forming first and second gate patterns (140a) coupling first and second pillar patterns (105a, 105b) to the first buried bit line (120a), respectively, forming a first body contact pattern (160a) extending from the first upper substrate (100a1) and coupled to any of the first and the second pillar patterns (105a, 105b).

Figure 2F:
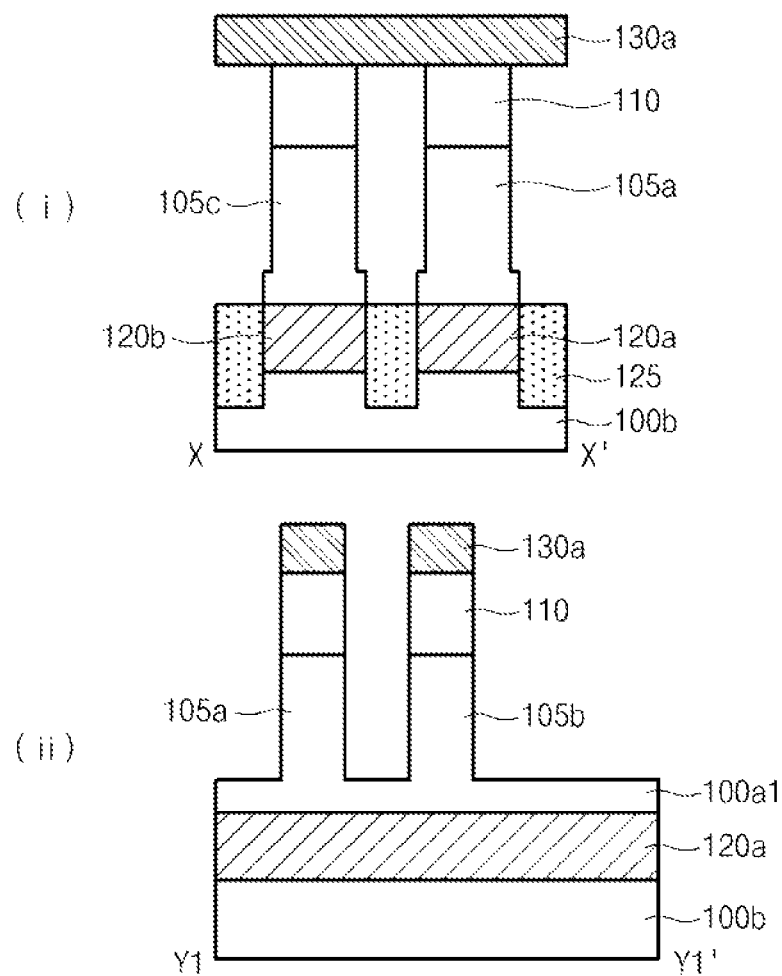

Referring to FIG. 2f, the first interlayer insulating layer is partially removed to expose sidewalls of the first hard mask pattern 110, the pillar patterns 105a-d, and the (silicon) lines 100a1, 100a2 on the bit lines 120a, 120b. At this time, the first interlayer insulating layer 125 may be removed through a cleaning process and the cleaning process may be performed to inject an etchant through an exposed portion, thereby removing the oxide layer.

Figure 2G:
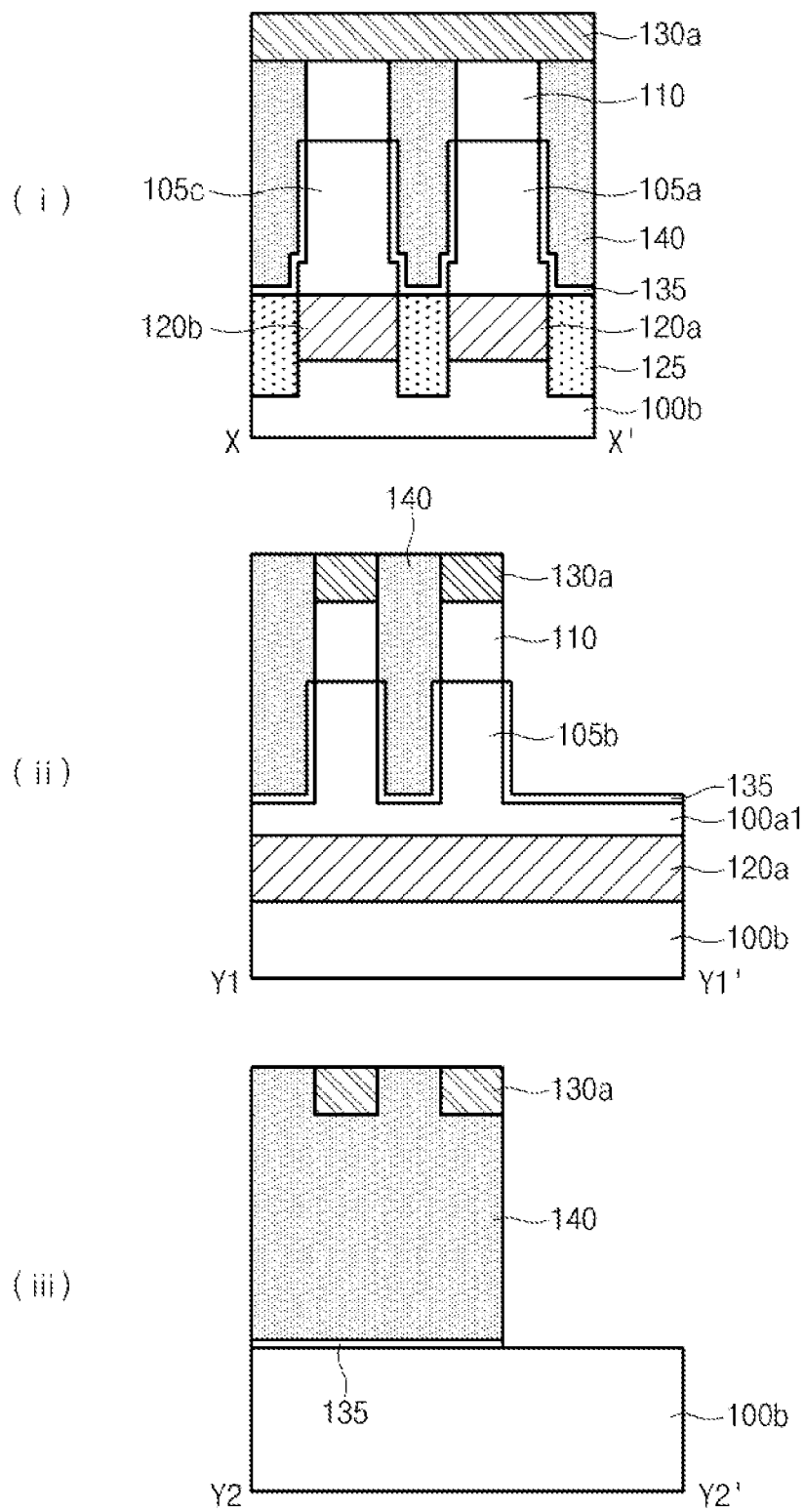

In the cleaning process, the liner insulating layer 115 on the sidewalls of the pillar patterns 105a-d and the hard mask pattern 110 is also removed. Further, the first interlayer insulating layer 125 may be removed until an upper surface level of the interlayer insulating layer 125 becomes an upper surface level of the bit line 120a, 120b. At this time, the first interlayer insulating layer 125 may be removed so that the upper surface level of the first interlayer insulating layer 125 is lower than the upper surface level of the bit line 120a, 120b. Referring to FIG. 2g, a first gate insulating layer 135 is formed on exposed sidewalls of the pillar patterns 105a-d. At this time, the first gate insulating layer 135 may be an oxide layer formed through an oxidation process.

Subsequently, a gate material 140 is formed in a portion in which the first interlayer insulating layer 125 from removed. The gate material 140 may include a material such as titanium nitride, tungsten, or a combination thereof.

Here, when the gate material 140 comprises a titanium nitride layer, TiCl$_4$, TDMAT(Ti(N[CH$_3$]$_2$)$_4$), or a combination thereof may be used as a source gas. Further, when the gate material 140 comprises tungsten, a thermal treatment chemical vapor deposition (CVD) apparatus may be used with WF$_6$, B$_2$BH$_6$, H$_2$, and SiH$_4$ as an example of source gases.

Figure 2H:
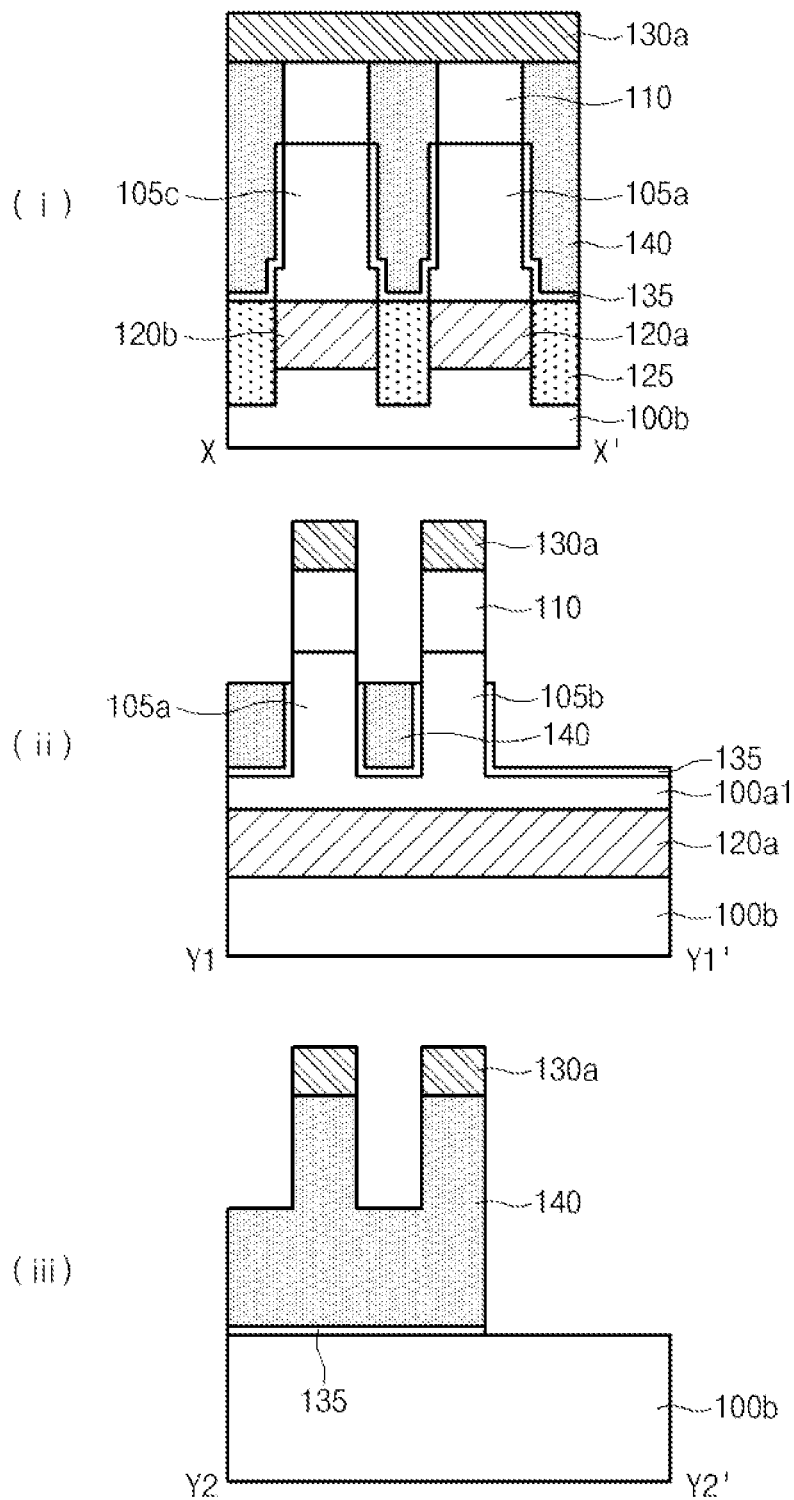

Referring to FIG. 2h, a planarization process is performed until the second hard mask pattern 130a is exposed.

Next, an etching back process is performed to partially etch the gate material 140. In the etching back process, since the second hard mask pattern 130a serves as a barrier, a portion of the gate material 140 exposed by the second hard mask pattern 130a may be etched. The process is now described in more detail.

As shown in FIG. 2h(i), the gate material 140 remains below the second hard mask pattern 130a intersecting the bit lines 120a-b. That is, the gate material 140 is not removed between the pillar patterns arranged in the X-X' direction.

On the other hand as shown in FIG. 2h(ii) an upper portion of the gate material 140 exposed by the second hard mask pattern 130a, is partially etched. That is, the gate material 140 remains in a lower portion between the pillar patterns 105a-d arranged in the Y1-Y1' direction.

Figure 2I:
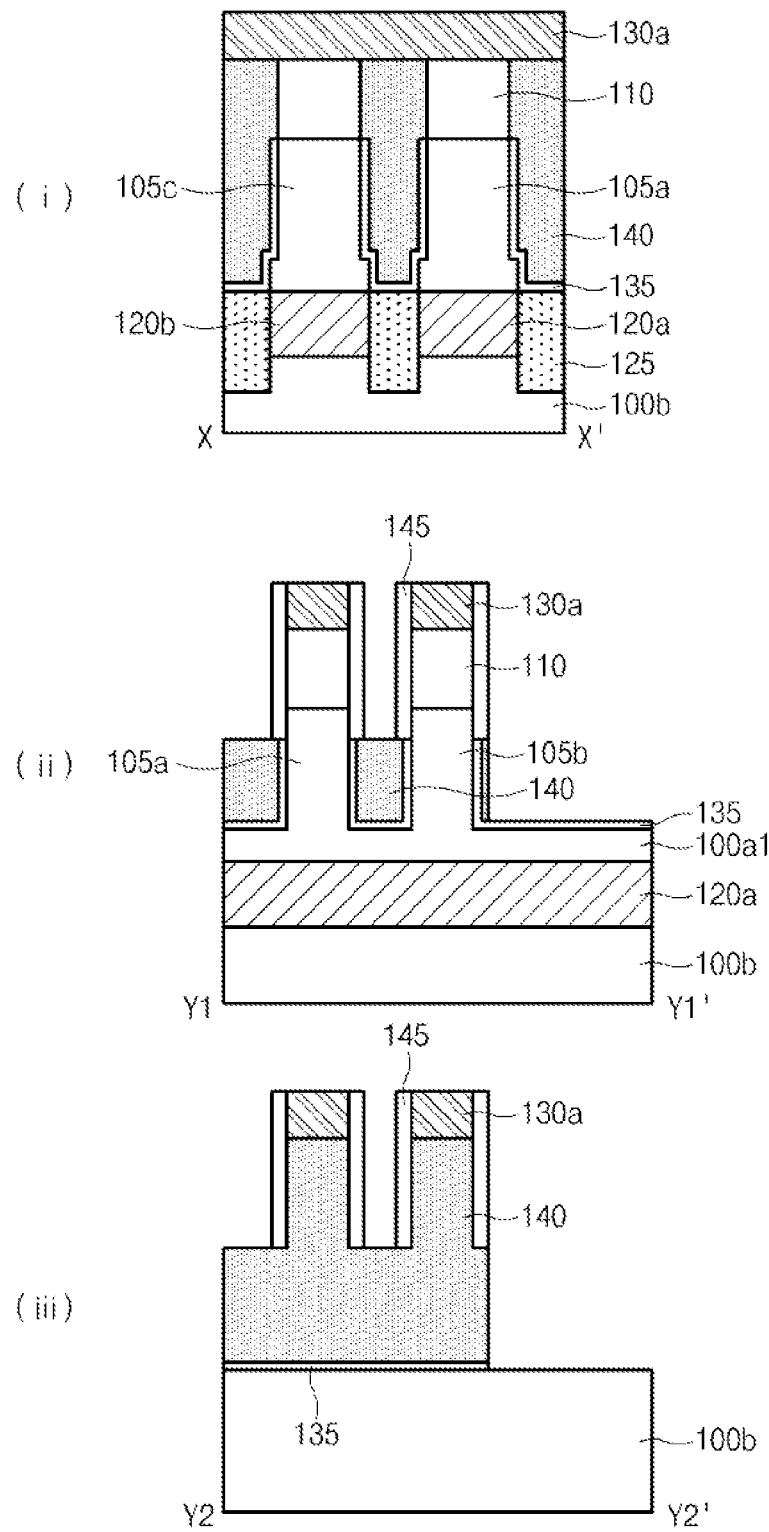

Referring to FIG. 2i, a spacer 145 is formed on sidewalls of the second hard mask pattern 130a, the first hard mask pattern 110, the pillar patterns 105a-d, and the gate material 140. That is, the spacer 145 is formed along the Y1-Y1' direction.

Figure 2J:
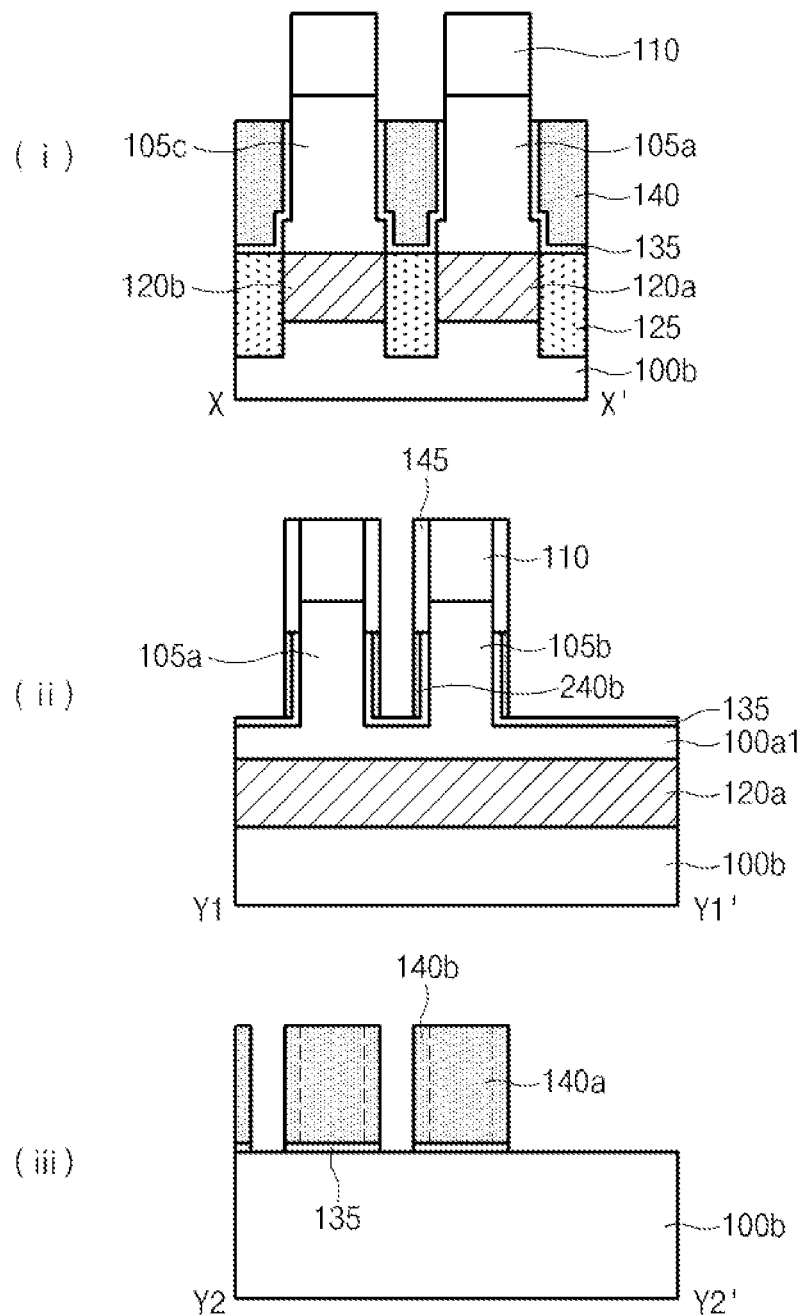

Subsequently, referring to FIG. 2j, the second hard mask pattern 130a is removed. At this time, while the second hard mask pattern 130a is removed, a spacer on the sidewall of the second hard mask pattern 130a is also removed. That is, the spacer 145 remains on the sidewall of the first hard mask pattern 110. The gate material 140 is etched using the spacer 145 as an etch mask to simultaneously form vertical gates 140a-d and first and second word lines 240a-b. The first word line 240a is coupled to the first and the third pillar patterns 105a, 105c. The second word line 240b is coupled to the second and the fourth pillar patterns 105b, 105d. See FIG. 1.

A distance between the vertical gate 140a-d and the bit line 120a-b is spaced apart by the upper substrate 100a1, 100a2. The gate 140a-d is in contact with or overlaps with the bit line 120a so as to form a channel. The gate 140a-d may extend downwardly to reach to the upper surface level of the bit line 120a-b. At this time, the length of the gate 140a-d may further extend to partially overlap with the bit line 120a-b.

Figure 2K:
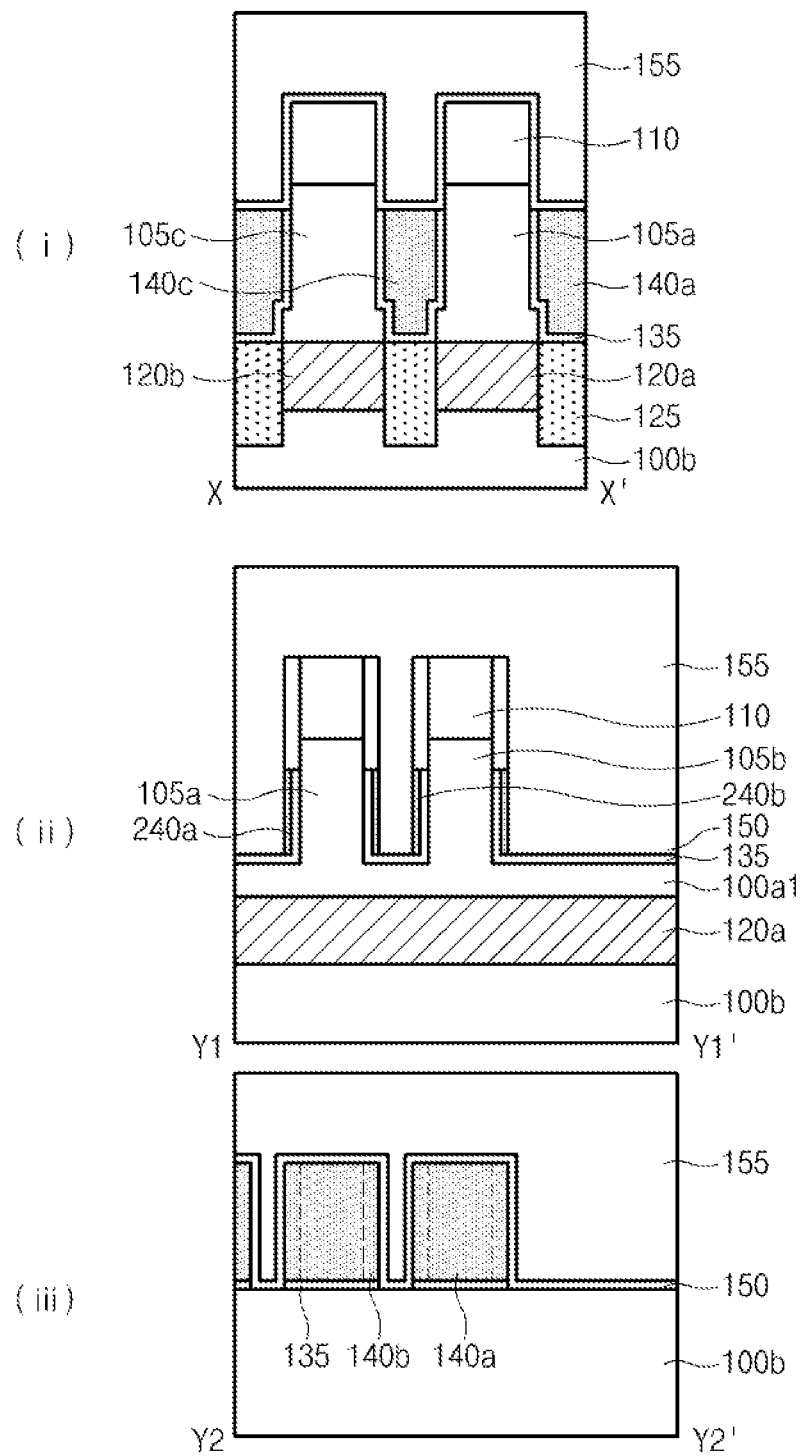
Figure 21:
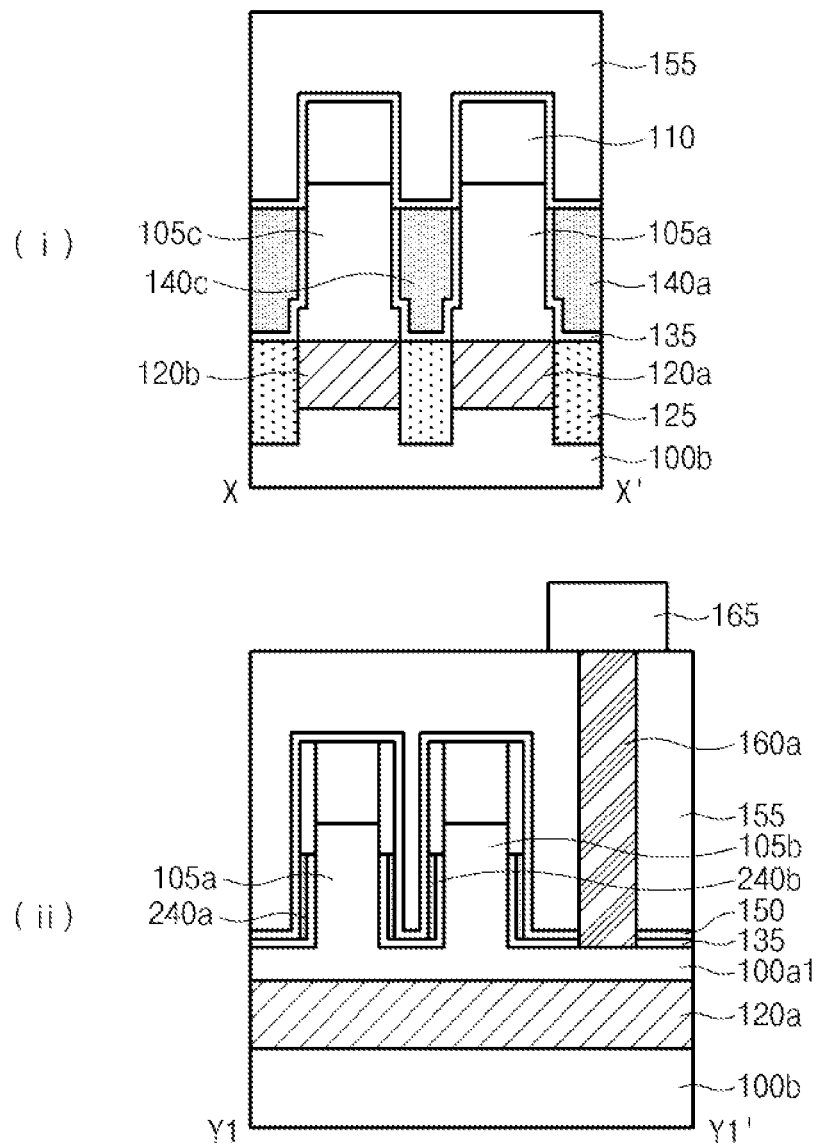

Referring to FIG. 2K, a second gate insulating layer 150 is formed an entire surface of the semiconductor structure including the word lines 240a-b, the gates 140a-d, the first hard mask pattern 110 and the pillar patterns 105a-d. The second gate insulating layer 150 may be an oxide layer formed through an oxidation process. Next, a second interlayer insulating layer 155 is formed on an entire surface of the second gate insulating layer 150. At this time, the second interlayer insulating layer 155 may include an oxide layer and covers the pillar patterns 105a-d, the gates 140a-d, and the word lines 240a-b.

Referring to FIG. 2L, the second interlayer insulating layer 155, the second gate insulating layer 135, and the first gate insulating layer 135 are etched to form a contact hole exposing the upper substrate 100a1, 100a2. At this time, the contract hole may be formed in the portion in which a relative wide space A is ensured between the pillar patterns 105a in the Y1-Y1' direction. A position in which the contact hole is formed is not limited to a specific region and the contact hole may be formed in a region having a spared space margin. Here, the position in which the contact hole is to be formed is previously ensured as shown in FIG. 2A so that the contact hole is formed to the determined position. Subsequently, a conductive material fills the contact hole to form the body contact 160a, 160b. Hereafter, a metal interconnection 165 is formed on the second interlayer insulating layer 155 to be connected with the body contact 160a, 160b. The metal interconnection 165 may be grounded.

As described above, the upper substrate 100a1, 100a2 is formed between the vertical gate 140a-d and the buried bit line 120a-b in the same direction as the buried bit line 120a-b. The body contact 160a-b is coupled to the upper substrate 100a1, 100a2, thereby coupled to the vertical pillar patterns 105a-d. A bias is applied to the upper substrate 100a1, 100a2 through the body contact 160a, 160b to remove holes in the pillar pattern 105a-d, thereby preventing the floating body effect.

According to the particular embodiment of the semiconductor device and the method of manufacturing the same described above, after the silicon lines having the same type as the pillar patterns are formed the vertical gate, the bit line and the body contact are formed on the silicon lines, a bias applied through the body contacts thereby removes the holes in the pillar patterns. Thus, the floating body effect is prevented to improve operation characteristics of the devices.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A semiconductor device, comprising:
   a plurality of line patterns formed on a semiconductor substrate;
   pillar patterns formed by etching upper portions of the line patterns;
   a plurality of gates intersecting the line patterns and formed between the pillar patterns;
   word lines intersecting the line patterns and formed on sidewalls of the plurality of pillar patterns; and
   body contacts formed on some of the line patterns between the pillar patterns.

2. The semiconductor device of claim 1, further comprising a bit line disposed within each of the line patterns.

3. The semiconductor device of claim 2, wherein the bit line includes a bit line junction region.

4. The semiconductor device of claim 2, wherein the bit line is formed to be spaced at a constant distance from an upper surface of each of the line patterns.

5. The semiconductor device of claim 1, further comprising a plurality of gates between pillar patterns in a direction intersecting the line patterns.

6. The semiconductor device of claim 5, wherein each of the word lines connects gates of the plurality of gates arranged in the direction intersecting the line patterns.

7. The semiconductor device of claim 5, wherein each of the gates is formed on a sidewall of each of the pillar patterns and the gate is formed to have the same surface level as an upper height of the bit line or to extend by a depth overlapping with the bit line.

8. A semiconductor device, comprising:
   a first buried bit line provided between a lower substrate and a first upper substrate;
   first and second pillar patterns extending from the first upper substrate and coupled to the first buried bit line;
   a first gate pattern coupled to the first pillar pattern and a second gate pattern coupled to the second pillar pattern; and
   a first body contact pattern coupled to any of the first and the second pillar patterns,
   wherein the first buried bit line is arranged along a first direction (A direction), and the first body contact pattern is arranged along a second direction (B direction) perpendicular to the first direction,
   wherein the first and the second gate patterns are arranged along the second direction (B direction).

9. The semiconductor device of claim 8, wherein the first body contact pattern is commonly coupled to the first and the second pillar patterns through the first upper substrate.

10. The semiconductor device of claim 8, wherein the first body contact pattern is formed parallel to a direction of the first and the second pillar patterns.

11. The semiconductor device of claim 8, wherein the first body contact pattern includes conductive material.

12. The semiconductor device of claim 8, wherein the first body contact pattern is grounded or fixed at given voltage level.

13. The semiconductor device of claim 8, wherein the first body contact pattern is coupled to any of the first and the second pillar patterns through the upper substrate.

14. The semiconductor device of claim 8, the device further comprising:
   a second buried bit line provided between the lower substrate and a second upper substrate and arranged in parallel to the first buried bit line;
   third and fourth pillar patterns coupled to the second buried bit line through third an fourth gate patterns, respectively; and
   a second body contact pattern coupled to any of the third and the fourth pillar patterns.

15. The semiconductor device of claim 14, wherein the second body contact pattern is commonly coupled to the third and the fourth pillar patterns through the second upper substrate.

16. The semiconductor device of claim 14, wherein the second body contact pattern is arranged perpendicular to the second buried bit line.

17. The semiconductor device of claim 14, the device further comprising:
   a first word line coupled to the first and the third gate patterns, and
   a second word line coupled to the second and the fourth gate patterns.

18. The semiconductor device of claim 14,
   wherein the first and the second buried bit lines are each arranged along a first direction,
   wherein the first and the second body contact patterns are each arranged along a second direction perpendicular to the first direction, and
   wherein the first and the second word lines are each arranged along a third direction perpendicular to both of the first and the second directions.

19. The semiconductor device of claim 1,
   wherein the plurality of gates and the word lines are formed over different sidewalls of the pillar patterns from each other.

20. The semiconductor device of claim 1,
   wherein the plurality of gates, the word lines, and the plurality of line patterns extend in different directions from each other.

21. The semiconductor device of claim 1,
   wherein the body contacts, the word lines, and the plurality of line patterns extend in different directions from each other.

22. The semiconductor device of claim 1,
   wherein the body contacts and the plurality of gates extend in directions parallel to each other.

23. The semiconductor device of claim 1,
   wherein the body contacts and the pillar patterns extend in directions parallel to each other.

24. The semiconductor device of claim 1,
   wherein the plurality of gates extend to a deeper depth than the word lines.

25. The semiconductor device of claim 1,
wherein the word lines are formed at a first level,
wherein the plurality of line patterns are formed at a second level lower than the first level, and
wherein the plurality of gates extend from the first level to the second level and further extend from over sidewalk of the pillar patterns to over sidewalk of the plurality of line patterns.

* * * * *